United States Patent
Fukada (10) Patent No.: US 8,901,506 B2
(45) Date of Patent: Dec. 2, 2014

(54) AIR ION MEASURING APPARATUS

(75) Inventor: Yoshinari Fukada, Tokyo (JP)

(73) Assignee: Koganei Corporation, Tokyo (JP)

( * ) Notice: Subject to any disclaimer, the term of this patent is extended or adjusted under 35 U.S.C. 154(b) by 98 days.

(21) Appl. No.: 13/809,684

(22) PCT Filed: Jan. 27, 2011

(86) PCT No.: PCT/JP2011/051609
§ 371 (c)(1),
(2), (4) Date: Jan. 11, 2013

(87) PCT Pub. No.: WO2012/011293
PCT Pub. Date: Jan. 26, 2012

(65) Prior Publication Data
US 2013/0105700 A1    May 2, 2013

(30) Foreign Application Priority Data

Jul. 22, 2010   (JP) ................................. 2010-165206

(51) Int. Cl.
H05F 3/04 (2006.01)
H01T 19/00 (2006.01)
G01R 19/00 (2006.01)

(52) U.S. Cl.
CPC *H05F 3/04* (2013.01); *H01T 19/00* (2013.01); *G01R 19/0061* (2013.01)
USPC ....................................................... 250/389

(58) Field of Classification Search
CPC ......... G01N 27/333; H05F 3/04; H01T 19/00
USPC ....................................................... 250/389
See application file for complete search history.

(56) References Cited

U.S. PATENT DOCUMENTS 4,357,143 A * 11/1982 Scott ........................... 205/778.5
4,451,736 A *  5/1984 Cameron ....................... 250/376

(Continued)

FOREIGN PATENT DOCUMENTS

JP       11007914 A    1/1999
JP     2001013109 A    1/2001

(Continued)

OTHER PUBLICATIONS

Corresponding Korean office action dated Jan. 13, 2014.

(Continued)

*Primary Examiner* — Marcus Taningco
(74) *Attorney, Agent, or Firm* — McCormick, Paulding & Huber LLP

(57) ABSTRACT

An air ion measuring apparatus (20) is used for measuring the amount of ions in ionized air generated by an ion generating apparatus (10) having a discharge electrode (11) and a nozzle (12) serving as a discharge electrode. The air ion measuring apparatus (20) has a cylindrical electrode (22), and when the length of the cylindrical electrode (22) is denoted by "l", a flow rate of air which flows through the cylindrical electrode (22) is denoted by "U", detection current which flows in the electrode 22 is denoted by "$I_m$", time constant is denoted by "τ", and the detection current "$I_m$" is denoted by a current detector (33), current generated by passage of ion is calculated by $$I_0 = \frac{U\tau + l}{l} I_m [A],$$

it is possible to measure the amount of ions from the calculated carried ion current "$I_0$", and to measure the amount of ions while splaying the ionized air to an object required to be electrically neutralized.

16 Claims, 5 Drawing Sheets

(56) References Cited

U.S. PATENT DOCUMENTS

| | | | |
|---|---|---|---|
| 5,847,917 A * | 12/1998 | Suzuki | 361/213 |
| 6,462,552 B1 * | 10/2002 | Suzuki | 324/458 |
| 7,836,751 B2 | 11/2010 | Marra | |
| 7,857,892 B2 | 12/2010 | Marra | |
| 2002/0158635 A1 * | 10/2002 | Higo | 324/439 |

FOREIGN PATENT DOCUMENTS

| | | |
|---|---|---|
| JP | 2005166268 A | 6/2005 |
| JP | 2008509802 A | 3/2008 |

OTHER PUBLICATIONS

Asano et al., Measurement of AC Ion Current from Ionizer by Using Faraday Cage, 2007 IEEE, Sep. 2007.

Y. Fukada, et al.,"An Estimation for Relaxation Characteristics of an Ionizer Ion Cloud Density Transferred through a Pipe via Hyperbolic Law", 2009 Electrostatics Joint Conference, Jun. 2009, P1.24, 6p.

Yoshinari Fukada et al., "An Estimation of Ion Cloud Density Transferred through a Pipe by a Ring Type Faraday Cage", Proceedings of Annual Meeting of the Institute of Electrostatics Japan 2010, [ISSN:1342-1492], Sep. 2010, pp. 305-308.

International Search Report for PCT/JP2011/051609 dated Feb. 18, 2011.

* cited by examiner

$l$ : Cylindrical Electrode Length
$l_1$ : Ion Cluster Length
$l_2$ : Distance between Ion Clusters

Positive Ion Cluster

FIG. 6B

Negative Ion Cluster

FIG. 7

| Frequency (Hz) | Ion Cluster Length $l_1$ (mm) | Distance between Ion Clusters $l_2$ (mm) |
|---|---|---|
| 100 | 240.9 | 209.1 |
| 30 | 80.3 | 69.7 |
| 1000 | 24.1 | 20.9 |
| 3000 | 8.0 | 7.0 |
| 10000 | 2.4 | 2.1 |
| 30000 | 0.8 | 0.7 |
| 100000 | 0.2 | 0.2 |

AIR ION MEASURING APPARATUS

TECHNICAL FIELD

The present invention relates to an air ion measuring apparatus for measuring the amount of ions in air ionized by corona discharge.

BACKGROUND ART

As a countermeasure against static electricity, to spray air ion to an electrically-charged body as an object required to be electrically neutralized and to electrically neutralize the object, an ion generating apparatus which is also referred to as "ionizer" or "charge neutralization apparatus" is used. In a manufacturing line for manufacturing and assembling electronic components, the ion generating apparatus is used for removing static electricity from the electronic components, manufacturing and assembling jigs and the like as the object. By spraying air ion to the object, foreign substances can be prevented from being adhered to the electronic components and the like by the static electricity, and the electronic components can be prevented from being broken or adhered to the jigs by the static electricity.

The ion generating apparatus used for a purpose such as this ionizes air by applying an alternating voltage between a discharge electrode and an opposite electrode and generating corona discharge around the discharge electrode with compressed air being supplied to the discharge electrode from outside. By an alternating corona discharge method in which an alternating voltage is applied between those electrodes, positive and negative ions are alternatively and periodically generated.

A positive/negative air ion measuring apparatus configured to measure the amount of positive ions and the amount of negative ions at the same time is described in Patent Document 1, and a charge neutralization apparatus configured to measure the amount of ions in ionized air is described in Patent Document 2.

PRIOR ART DOCUMENTS

Patent Documents

Patent Document 1: Japanese Patent Application Laid-Open Publication No. 2001-13109
Patent Document 2: Japanese Patent Application Laid-Open Publication No. 2005-166268

DISCLOSURE OF THE INVENTION

Problems to be Solved by the Invention

The positive/negative air ion measuring apparatus described in Patent Document 1 has two pair of detectors each having an cylindrical electrode and a collecting electrode as a pair of electrodes, and is configured to measure the amount of positive and negative ions by measuring a current corresponding to the number of positive ions in ionized air with use of one detector and measuring a current corresponding to the number of negative ions in ionized air with use of the other detector. This air ion measuring apparatus is a measuring apparatus for testing the performance of an ion generating apparatus, and is configured to measure the amount of positive ions and the amount of negative ions by measuring a current corresponding to the number of all ions in ionized air generated by the ion generating apparatus. Thus, since the air ion measuring apparatus described in Patent Document 1 is used for measuring a current corresponding to the number of all ions in ionized air, under the actual service condition of the ion generating apparatus, it is impossible to measure the amount of ions in ionized air.

On the other hand, the charge neutralization apparatus described in Patent Document 2 is configured to measure the amount of ions by causing ionized air to pass through a hollow coil to produce a current to flow through the coil and detecting a magnetic field generated by the current flowing through the coil. However, since the amount of ions in the ionized air is very small, it is extremely difficult to measure the amount of ions with a high degree of accuracy from the current flowing through the coil.

An object of the present invention is to measure the amount of ions in ionized air with a high degree of accuracy.

Another object of the present invention is to measure the amount of ions in ionized air with a high degree of accuracy while spraying the ionized air to an object to be electrically neutralized.

Means for Solving the Problems

An air ion measuring apparatus according to the present invention measures the amount of ions in ionized air with use of an electrode, wherein when the length of the electrode is denoted by "l", a flow rate of air is denoted by "U", a detection current in the electrode is denoted by "$I_m$", and a time constant is denoted by "$\tau$", a carried ion current "$I_0$" is calculated by $$I_0 = \frac{U\tau + l}{l} I_m.$$

In the air ion measuring apparatus according to the present invention, the electrode is a cylindrical electrode formed with a hole through which ionized air is passed. The air ion measuring apparatus according to the present invention has an ion generating apparatus having a discharge electrode and an opposite electrode, wherein an ion generating space is formed between the opposite electrode and the discharge electrode, wherein the ion generating apparatus ionizes air in the ion generating space by corona discharge which is generated by an alternating voltage applied to the discharge electrode and the opposite electrode, wherein the length of each electrode through which ionized air ejected from the ion generating space is passed is smaller than a distance between ion clusters, which is calculated from a period in which positive ions is generated in the ion generating space, a period in which negative ions is generated in the ion generating space, and the flow rate of air. The air ion measuring apparatus according to the present invention has flow rate detecting means for detecting the flow rate of air. The air ion measuring apparatus according to the present invention has first and second electrodes for measuring the amount of ions in ionized air, wherein the first and second electrodes are separated from each other in a flowing direction of the ionized air, wherein the velocity of air is calculated from a detection time lag between a detection current in the first electrode and a detection current of the second electrode. The air ion measuring apparatus according to the present invention has flow rate setting means for setting a flow rate of air.

Effects of the Invention

According to the present invention, the carried ion current is calculated by detecting a current which is flowed in an electrode by ions in the ionized air, and multiplying a transformation coefficient obtained from the length of the electrode, the flow rate of air, and the time constant, by the detected current, and the amount of ions corresponding to the carried ion current can be calculated with a high degree of accuracy. Therefore, it is possible to calculate the amount of ions carried toward the object with a high degree of accuracy while spraying the ionized air to an object required to be electrically neutralized.

According to the present invention, the amount of ions in the ionized air can be measured while spraying the ionized air to the object from the ion generating apparatus in which the ion generating space is formed between the discharge electrode and the opposite electrode. As a period between a positive ion cluster period (i.e., a period in which positive ion cluster is generated in the ion generating space) and a negative ion cluster period (i.e., a period in which negative ion cluster is generated in the ion generating space), a period between ion clusters is defined, and the distance between ion clusters is calculated by multiplying the period between ion clusters by the flow rate of air. The amount of carried ions can be measured with a high degree of accuracy by setting the length of the electrode for measuring the detection current to be shorter than the distance between ion clusters.

The flow rate of air to be supplied to the electrode may be detected, and air may be supplied to the electrode at a constant flow rate which is determined in advance. Furthermore the flow rate of air may be detected by the detection time lag between currents in two electrodes distant from each other.

BEST MODE FOR CARRYING OUT THE INVENTION

Figure 1:
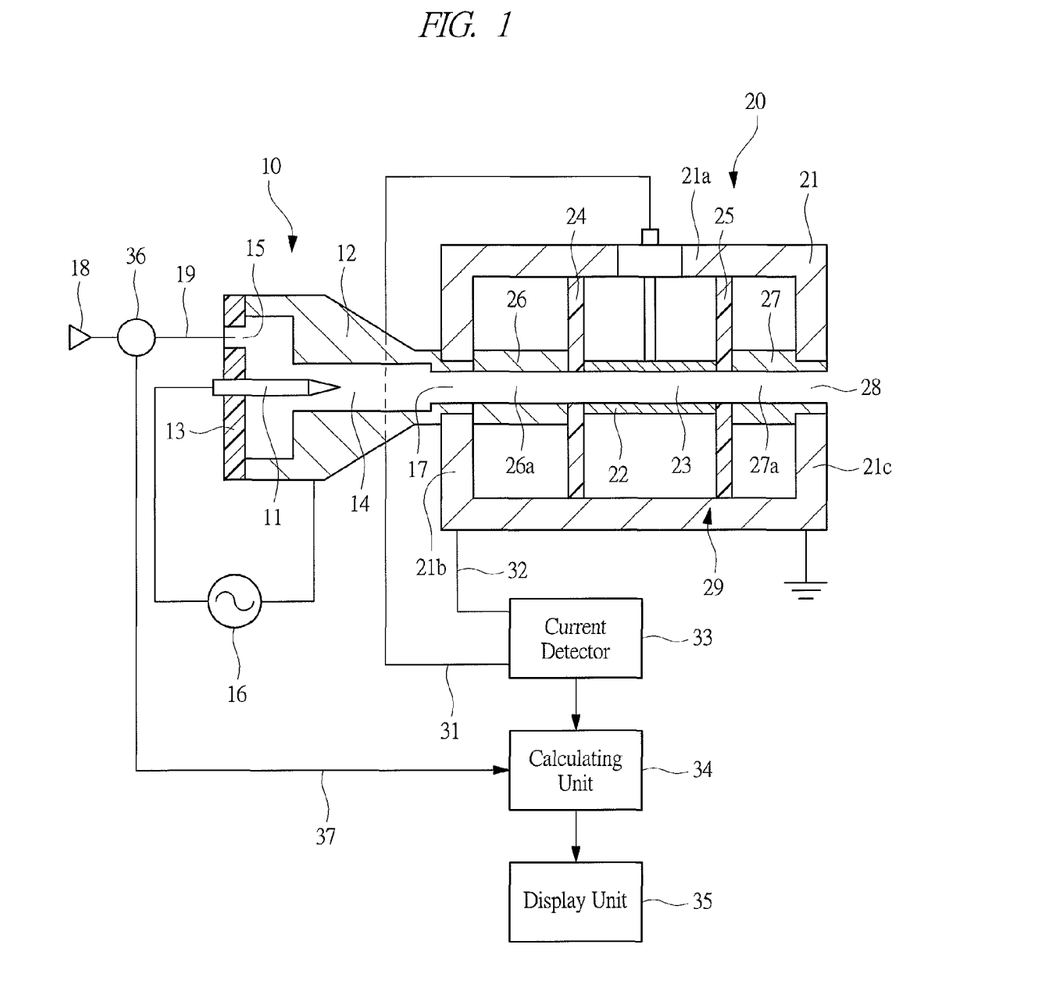
FIG. 1 is a cross sectional view showing an air ion measuring apparatus according one embodiment of the present invention.

Hereinafter, embodiments of the present invention will be described in detail with reference to the drawings. FIG. 1 shows a nozzle-type ion generating apparatus 10 provided with an air ion measuring apparatus. This nozzle-type ion generating apparatus 10 has a nozzle 12 with a built-in discharge electrode 11, and the nozzle 12 is formed of electrically conductive material as well as the discharge electrode 11, and functions as an opposite electrode. The discharge electrode 11 is attached to a holder 13 made of insulating material such as resin, and the nozzle 12 is attached to the holder 13.

The nozzle 12 is formed with an ion generating space 14, and air is supplied from an air supply port 15 formed in the holder 13 to this ion generating space 14. The discharge electrode 11 and the nozzle 12 are electrically connected to an alternating-current high-voltage power source 16. When an alternating-current high voltage is applied from the alternating-current high-voltage power source 16 to the discharge electrode 11 and the nozzle 12 as the opposite electrode, air flowing in the ion generating space 14 along the tip end portion of the discharge electrode 11 is ionized by corona discharge. The ionized air is ejected from an ejection port 17 provided at the tip end of the nozzle 12 toward a downstream side. Compressed air is supplied from an air pressure source 18 to the air supply port 15 through a flow channel 19.

Since an air ion measuring apparatus 20 is attached to the tip end portion of the nozzle 12, the amount of ions in the ionized air can be continuously measured with the ionized air being sprayed from the air ion generating apparatus 10 to an object required to be electrically neutralized (hereinafter simply referred to as "object"). However, the air ion measuring apparatus 20 may be detachable from the nozzle 12, and the air ion measuring apparatus 20 may be attached to the air ion generating apparatus 10 when manufacturing and assembling or doing maintenance, and adapted to measure the amount of ions in the ionized air ejected from the nozzle 12 on a trial basis.

The air ion measuring apparatus 20 has a case body 21 which is attached to the nozzle 12. This case body 21 is made of electrically conductive material, and has a cylindrical portion 21a, and end plate portions 21b and 21c provided to respective ends of the cylindrical portion 21a. The case body 21 is grounded by a ground wire, and one end plate portion 21b is attached to the tip end portion of the nozzle 12. A cylindrical electrode 22 made of electrically conductive material is disposed in the case body 21, the cylindrical electrode 22 has a passage hole 23 through which the ionized air ejected from the ejection port 17 passes, and this passage hole 23 is axially aligned with the ejection port 17. Circular supporting plates 24 and 25 made of insulating material abut respective end faces of the cylindrical electrode 22, and outer peripheral surfaces of the supporting plates 24 and 25 abut an inner peripheral surface of the case body 21. A spacer 26 is disposed between the end plate portion 21b of the case body 21 and the supporting plate 24, and a spacer 27 is disposed between the end plate portion 21c and the supporting plate 25. Each of the spacers 26 and 27 is formed of electrically conductive material and has a passage hole 26a or 27a corresponding to the passage hole 23. However, each of the spacers 26 and 27 may be formed of insulating material.

A downstream side end portion of the spacer 27 in the downstream side is fixed to the end plate portion 21c, and an opening of the downstream-side end portion serves as an ejection port 28 from which the ionized air is sprayed to the object. Therefore, the air supplied to the ion generating space 14 is ionized by corona discharge in the ion generating space 14, and the ionized air flows into the passage hole 23 of the cylindrical electrode 22 in the air ion measuring apparatus 20 through the passage hole 26a of the spacer 26 and then is ejected from the ejection port 28 of the passage hole 27a of the spacer 27 to the outside.

The cylindrical electrode 22 is formed with the passage hole 23 for guiding the ionized air and made of metal, that is, the cylindrical electrode 22 having electrical conductivity. The cylindrical electrode 22 is incorporated in the case body 21. The case body 21 is electrically insulated from the cylindrical electrode 22, made of metal, that is, the case body 21 having electrical conductivity, and grounded. A main body 29 of this measuring apparatus has the function of Faraday cage, and is constituted by the cylindrical electrode 22 and the case body 21. When the ionized air flows into the passage hole 23 of the cylindrical electrode 22, ion current flows in the cylindrical electrode 22.

The case body 21 and the cylindrical electrode 22 are connected to a current detector 33 by cables 31 and 32, respectively. By dividing the electric potential of the cylindrical electrode 22 by impedance of this measurement system, an ion current corresponding to the amount of ions in the ionized air is detected by the current detector 33. Based on the detected ion current, that is, the detection current, the amount of ions generated in the ion generating space 14 and carried to the passage hole 23 is calculated by a calculating unit 34, and the result of this calculation is displayed by a display unit 35. A flow rate detector 36 is provided at the flow channel 19 as flow rate measuring means for measuring the flow rate of ionized air flowing from the ion generating space 14 to the passage hole 23 of the cylindrical electrode 22, and signals from the flow rate detector 36 are transmitted to the calculating unit 34 through a cable 37. However, the flow rate in the ion generating space 14 or the flow rate in the cylindrical electrode 22 may be directly detected by the flow rate detector.

Figure 2:
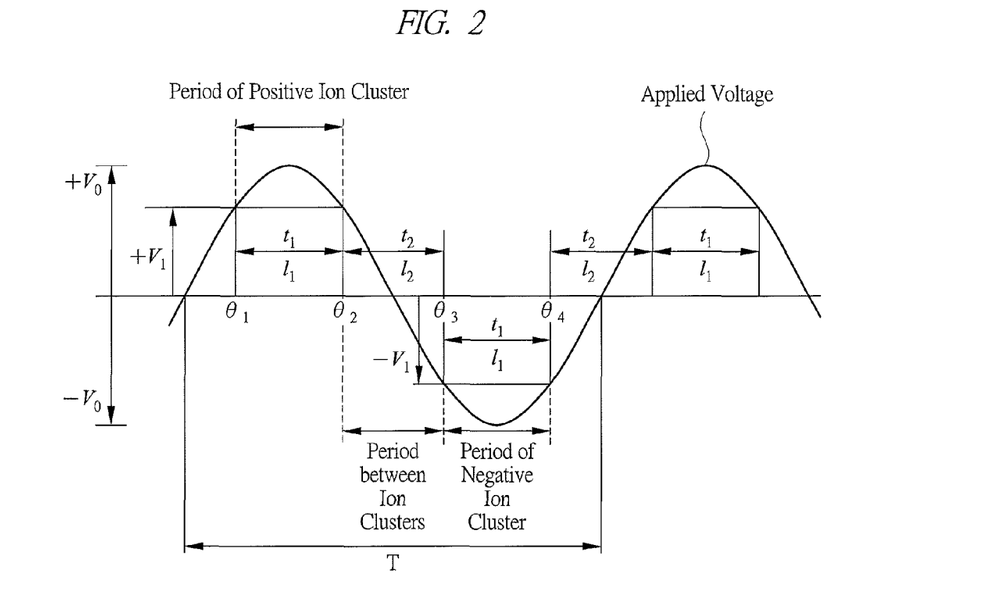
FIG. 2 is a timing chart showing a voltage applied to an ion generating apparatus and an ion cluster generating state corresponding to the voltage.
Figure 3:
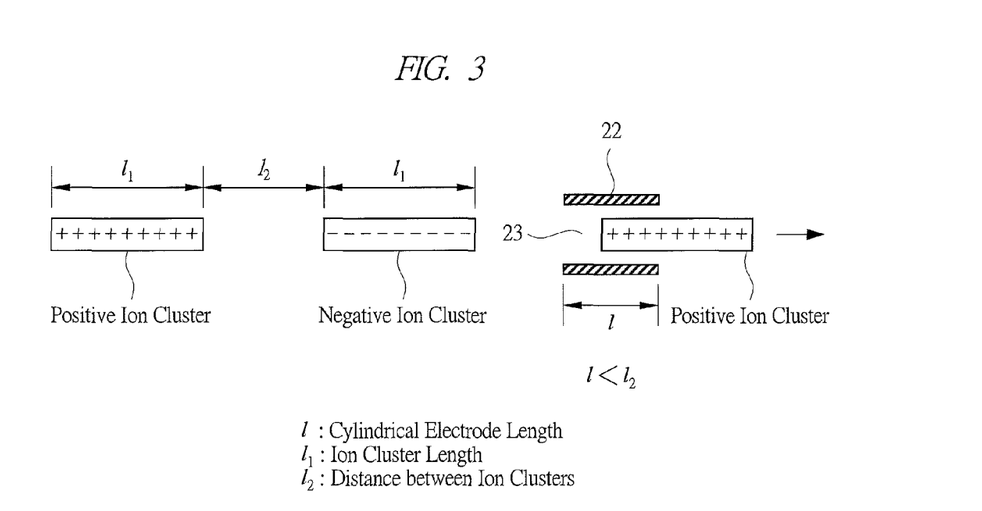
FIG. 3 is a timing chart showing a generating period of a positive ion cluster and a generating period of a negative ion cluster in an ion generating space.

FIG. 2 is a timing chart showing a voltage applied between the discharge electrode and the opposite electrode of the ion generating apparatus, and an ion cluster generating state based on the voltage. When air is ionized by corona discharge by applying an alternating voltage to the discharge electrode 11 and the nozzle 12 as the opposite electrode, a positive ion cluster and a negative ion cluster are alternately generated in the ion generating space 14. Each ion cluster has a constant length "$l_1$" by flowing air in the ion generating space 14, and the positive ion cluster and the negative ion cluster, which are separated from each other by a constant distance "$l_2$" between ion clusters, aligned in the same direction.

When peak values of the applied voltage supplied to the air ion generating apparatus 10 are denoted by "$\pm V_0$", and the waveform thereof is a sine wave alternating current, the applied voltage can be expressed by $V_0 \sin \theta$. When the frequency thereof is denoted by "f", discharge start/end voltage is denoted by "$\pm V_1$", the flow rate of ionized air is denoted by "U", a period in which the ion cluster is generated is denoted by "$t_1$", and a period between ion clusters is denoted by "$t_2$", the length "$l_1$" of ion cluster is calculated by $l_1 = U t_1$, and the distance "$l_2$" between ion clusters is calculated by $l_2 = U t_2$.

In FIG. 2, when a positive discharge start angle is denoted by "$\theta_1$", a positive discharge end angle is denoted by "$\theta_2$", a negative discharge start angle is denoted by "$\theta_3$", and a negative discharge end angle is denoted by "$\theta_4$", the following formulas are obtained.

$V_1 = V_0 \sin \theta_1$ $\sin \theta_1 = V_1/V_0$ $\theta_1 = \sin^{-1}(V_1/V_0)$ Therefore, the period "$t_2$" between ion clusters is obtained by $$t_2 = \frac{2\theta_1}{2\pi} T = \frac{T}{\pi} \sin^{-1}\left(\frac{V_1}{V_0}\right) \qquad (1)$$

The distance "$l_2$" between ion clusters is obtained by the following formula (2).

$$l_2 = U t_2 = \frac{UT}{\pi} \sin^{-1}\left(\frac{V_1}{V_0}\right) \qquad (2)$$

In addition, the period "T" of the applied voltage is calculated from the frequency "f".

In this manner, the distance "$l_2$" between ion clusters is calculated by the voltage "$\pm V_0$" of the applied voltage, the discharge start/end voltages "$\pm V_1$", the period "T" of the applied voltage, and the flow rate "U" of ionized air. Each ion cluster length "$l_1$" of the positive ion cluster and the negative ion cluster is also calculated by a similar formula.

The length "l" of the passage hole 23 of the cylindrical electrode 22 shown in FIG. 1 is set so as to be a length shorter than the distance "$l_2$" between ion clusters.

If the length "l" of the passage hole 23 is set to be longer than the distance "$l_2$" between ion clusters, a positive ion cluster and a negative ion cluster flow into the cylindrical electrode 22 at the same time. Since if the frequency "f" of the applied voltage is increased, before the cylindrical electrode 22 completes the capture of one of the positive and negative ion clusters, a following ion cluster, that is, the other of the positive and negative ion clusters starts to enter the cylindrical electrode 22, it is not possible to measure the amount of carried ions. On the other hand, when the length "l" of the cylindrical electrode 22 is set to be shorter than distance "$l_2$" between ion clusters in accordance with the frequency "f" of the applied voltage, the cylindrical electrode 22 completely detects the ions of one of the polarities and then detects the ions of the other polarity; therefore, the amount of the ions can be accurately measured on the basis of the value of the current which flows to the cylindrical electrode 22.

From our experiments and the like, it was found that attenuation of the amount of ions in a case where an ion cluster flows into a tube such as the passage hole 23 of the cylindrical electrode 22 corresponds to the hyperbolic law. Therefore, it is believed that the charge density is gradually attenuated according to the hyperbolic law when ion flows through the cylindrical electrode 22.

Figure 4:
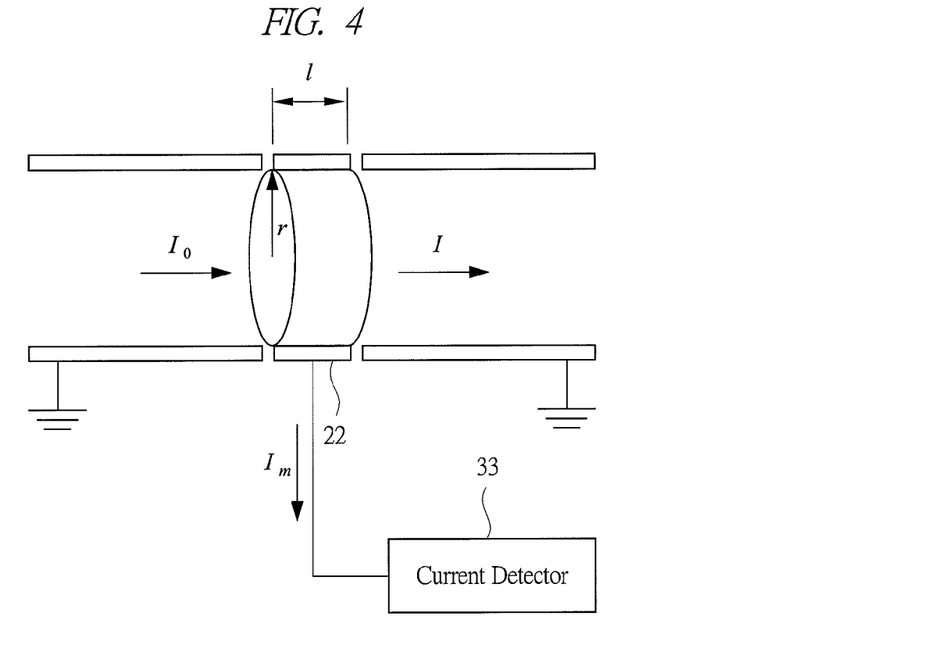
FIG. 4 is a schematic diagram showing a basic structure of the air ion measuring apparatus shown in FIG. 1.

FIG. 4 is a schematic diagram showing a basic structure of the air ion measuring apparatus shown in FIG. 1, and hyperbolic law in an attenuation model of the charge density in the air ion measuring apparatus is expressed by the following formula.

$$\frac{\rho}{\rho_i} = \frac{1}{1 + \frac{t}{\tau}} \qquad (3)$$

In this formula, "$\rho_i$" denotes an initial charge density, "$\rho$" denotes a charge density at time "t", and "$\tau$" denotes a time constant. And the time constant "$\tau$" is expressed by the following formula.

$$\tau = \frac{\varepsilon_0}{\rho_i \mu} \quad (4)$$

In this formula, "$\varepsilon_0$" denotes permittivity in vacuum, and "$\mu$" denotes mobility of ion. By replacing the time "t" of the formula (3) with the distance "d", the following formula is obtained.

$$\rho = \frac{\rho_i}{1 + \frac{d}{U\tau}} \quad (5)$$

In this formula, "d" denotes a carried distance, and "U" denotes an average flow rate of ion.

In FIG. 4, relationship among an ion current "$I_0$" due to ion carried from the ion generating space 14, detection current "$I_m$" measured by the cylindrical electrode 22, and an electrically neutralizing current "I" sprayed to the object through the cylindrical electrode 22 is expressed by the following formula on the basis of the current continuity.

$$I_0 = I + I_m \quad (6)$$

Each ion current is expressed as follows.

$$I_0 = \rho_0 \pi r^2 U \quad (7)$$

$$I = \rho \pi r^2 U \quad (8)$$

In this formula, "$\rho_0$" denotes the charge density of the ion current "$I_0$".

By substituting the formulas (7) and (8) into the formula (6) obtained from the current continuity, the following formula is obtained.

$$I_m = (\rho_0 - \rho) \pi r^2 U \quad (9)$$

By replacing the carried distance "d" of the formula (5) with the electrode length "l", the formula shown in parentheses of the formula (9) are obtained by the following formula (5).

$$\rho_0 - \rho = \rho_0 \frac{1}{U\tau + 1} \quad (10)$$

Therefore, the detection current "$I_m$" shown in the formula (9) is expressed as follows by using the formula (10).

$$I_m = \pi r^2 U \rho_0 \frac{1}{U\tau + 1} \quad (11)$$

As shown in the formula (11), when the flow rate "U" of air and the like is constant, the detection current "$I_m$" is changed in accordance with the length of the cylindrical electrode 22. When the peak values of the applied voltage are ±4.5 kV, the frequency of the applied voltage is 1 Hz, and the flow rate "U" of air is 90 m/s, the relation between the detection current "$I_m$" and the length of the cylindrical electrode 22 is shown in characteristic diagrams of FIGS. 6A and 6B according to the formula (11).

Figure 6A:
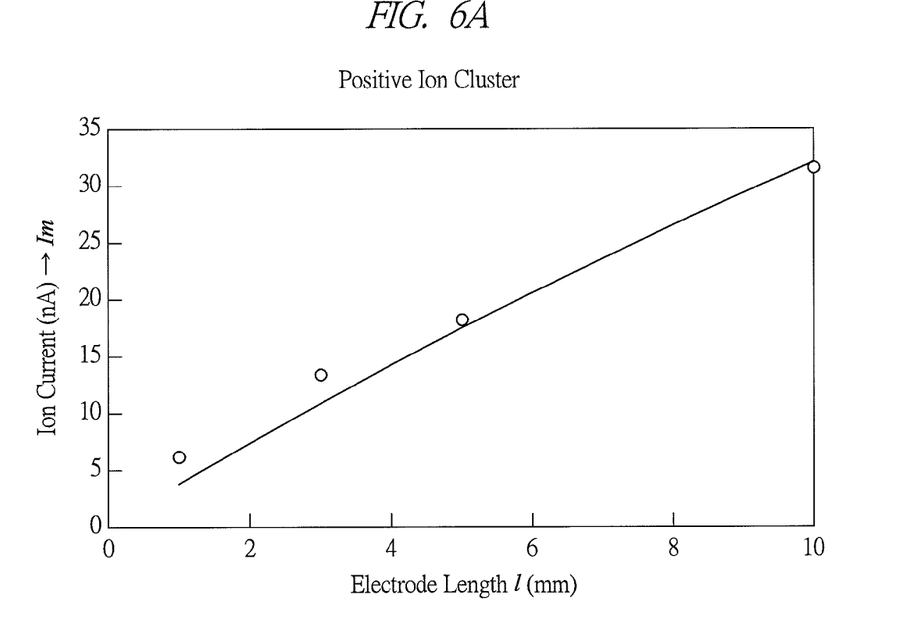
FIG. 6A is an ion current characteristic diagram showing the change of a detection current which is obtained when detecting an ion current of positive ions by changing the length of a cylindrical electrode in the air ion measuring apparatus.
Figure 6B:
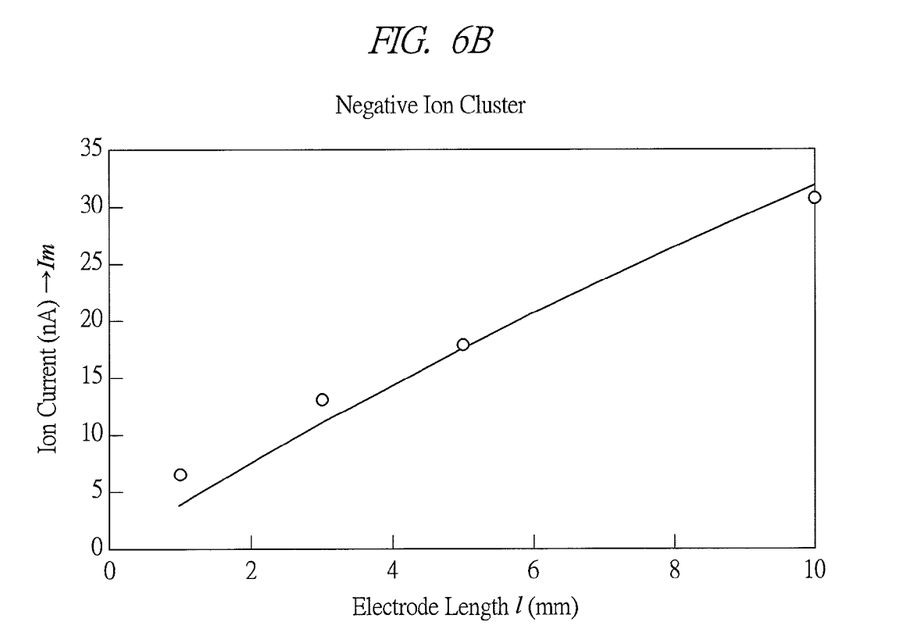
FIG. 6B is an ion current characteristic diagram showing the change of a detection current which is obtained when detecting an ion current of positive ions by changing the length of a cylindrical electrode in the air ion measuring apparatus.

When the current (detection current) "$I_m$" is measured for each of the positive ion cluster and the negative ion cluster while changing the length of the cylindrical electrode 22 to 1, 3, 5, and 10 mm under the above described condition of the applied voltage, it was confirmed that the results approximately match the theoretical formula shown in the formula (11).

Therefore, by setting the length of the cylindrical electrode 22, the ion current $I_0$ generated by the transportation of the ions in the ion generating space 14 can be obtained in the following manner by the formula (7) and the formula (11) on the basis of the relation between the length and the detection current "$I_m$".

$$I_0 = \frac{U\tau + 1}{1} I_m \quad (12)$$

The value excluding "$I_m$" of the right side of the formula (12) is a transformation coefficient for obtaining the ion current "$I_0$" when multiplied by the detection current "$I_m$" and has a constant value set by the length "l" of the cylindrical electrode 22, the flow rate "U" of the air, and the time constant "$\tau$".

The formula (12) can be expressed by the following formula.

$$I_0 = \frac{I_m + \sqrt{I_m^2 + 4k}}{2} \quad (13)$$

Here, $k = \frac{\pi I_m \varepsilon_0 r^2 U}{\mu l}$

The carried ion current "$I_0$" may be calculated on the basis of the formula (13).

In this manner, the carried ion current "$I_s$" can be obtained by detecting the detection current "$I_m$" by the current detector 33 and calculating the carried ion current "$I_s$" on the basis of the transformation coefficient according to the formula (12) by the calculating unit 34. Furthermore, according to the detection current "$I_m$" and the carried ion current "$I_s$", the actual amount of ion sprayed to the object can be also obtained from the ion current "I". In this manner, the detection current "$I_m$" which flows to the current detector 33 is part of the carried ion current "$I_s$", the amount of ions can be calculated from the part of the current, and the remaining ions other than ions consumed in this detection can be sprayed to the object. Thus, the amount of ions generated by the air ion generating apparatus 10 can be measured while actuating the air ion generating apparatus 10 and spraying the ionized air to the object.

The amount of ions corresponding to the carried ion current "$I_0$" is displayed on the display unit 35. Therefore, the amount of ions generated by the air ion generating apparatus 10 can be confirmed with the ionized air being sprayed to the object. If discharge performance is reduced due to, for example, wearing of the discharge electrode 11, an operator is informed of functional decline or trouble occurrence of the air ion generating apparatus 10 according to the amount of carried ions displayed by the display unit 35. If functional decline occurs in the air ion generating apparatus 10, the operator may be informed with, for example, a buzzer or sound.

Figure 5:
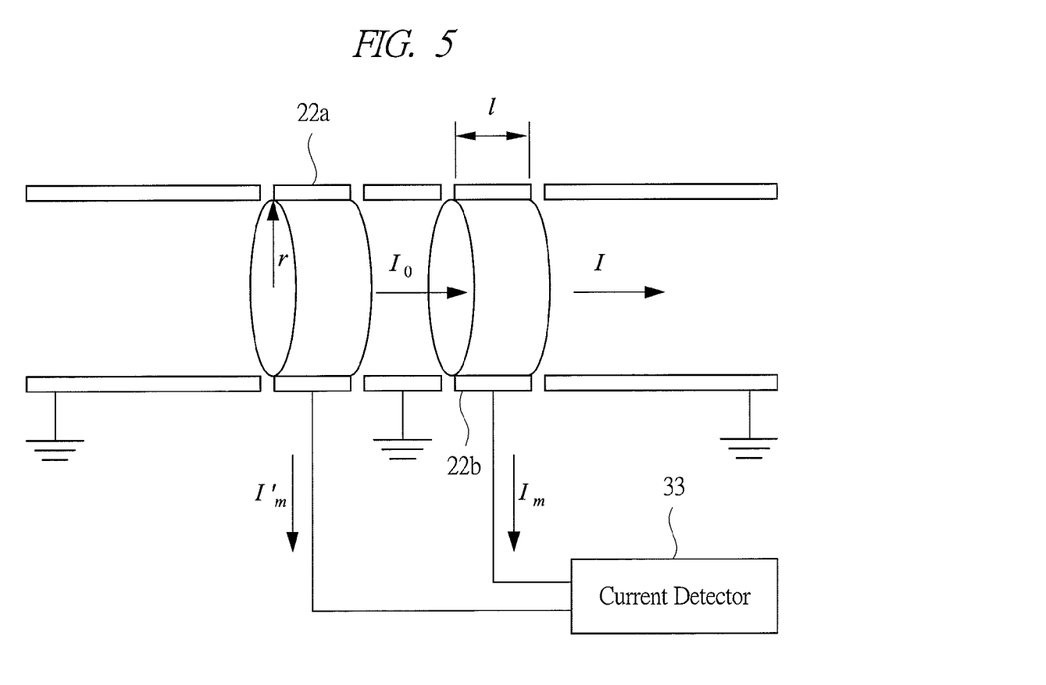
FIG. 5 is a schematic diagram showing a basic structure of an air ion measuring apparatus according to another embodiment of the present invention.

An air ion measuring apparatus shown in FIG. 5 has a first cylindrical electrode 22a and a second cylindrical electrode 22b disposed away from the first cylindrical electrode 22a in the flowing direction of the ionized air, detected signals of the cylindrical electrodes 22a and 22b are transmitted to the current detector 33. As a result, the flow rate of air can be calculated according to the detection time lag between the detection current "I'$_m$" of the first cylindrical electrode 22a and the detection current "I$_m$" of the second cylindrical electrode 22b. In this manner, the flow rate "U" of the ionized air may be calculated on the basis of the signals detected from the flow rate detector 36, or may be calculated on the basis of the detection time lag between the signals transmitted from the cylindrical electrodes 22a and 22b. Furthermore, the flow rate of air supplied to the ion generating space 14 may be set to a constant flow rate by, for example, a flow rate control valve, and in this case, the value of the flow rate "U" is stored in a memory (not shown), and a velocity signal is transmitted from the memory to the calculating unit 34. The above described carried ion current "I$_s$" is calculated on the basis of the transmitted velocity signal.

Figure 7:
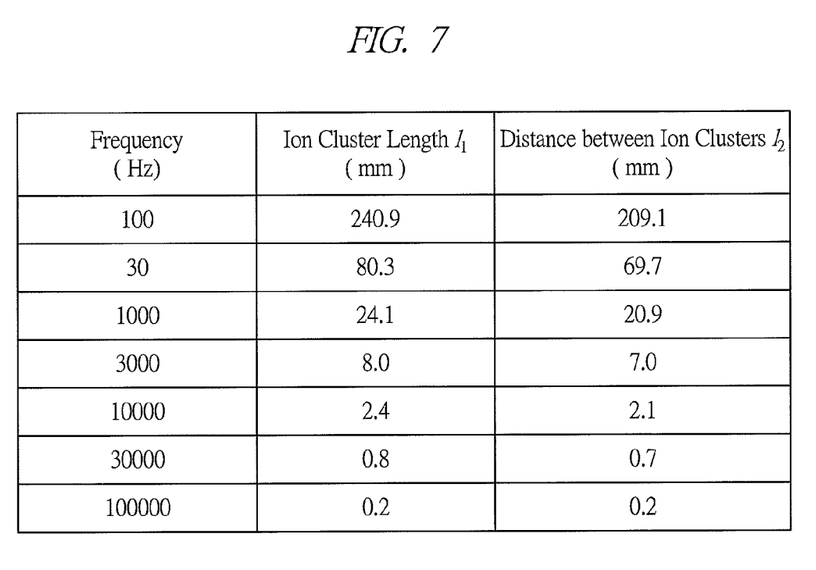
FIG. 7 is a table showing the relation between the length of ion cluster and the distance between ion clusters, which is obtained by changing the frequency of the applied voltage.

FIG. 7 is a table showing the relation between the ion cluster length "l$_1$" and the distance "l$_2$" between ion clusters in the case where the flow rate "U" of the ionized air is 90 m/s and the frequency "f" of the applied voltage is changed. For example, if the frequency "f" of the applied voltage is 1000 Hz, the length "l$_1$" of ion cluster is 24.1 mm, and the distance "l$_2$" between ion clusters is 20.9 mm. Therefore, in the case in which the frequency of the applied voltage is 1000 Hz, the length "l" of the cylindrical electrode 22 is set to 20.9 mm or less. In the cases in which the applied voltages having other frequencies are used, the length "l" of the cylindrical electrode 22 is set to be shorter than distance "l$_2$" between ion clusters, which is obtained in accordance with the corresponding frequency.

By setting the length "l" of the cylindrical electrode 22 constituting the Faraday cage to be shorter than distance "l$_2$" between ion clusters on the basis of the frequency of the applied voltage and the flow rate "U" of air, the current flowing through the cylindrical electrode 22 becomes equal to current value based on either only positive or only negative ions. Furthermore, since the apparatus is configured to obtain the amount of carried ions from the carried ion current "I$_0$" which is calculated from the detection current "I$_m$" detected by flowing part of each ion cluster through the cylindrical electrode 22, it is possible to measure the amount of ions generated in the ion generating space 14 with a high degree of accuracy, and the ionized air can be sprayed to the object while measuring the amount of ions.

The present invention is not limited to the above described embodiments, and various modifications can be made within the range not departing from the gist of the invention. For example, although the nozzle-type ion generating apparatus 10 is shown in FIG. 1, the air ion measuring apparatus according to the present invention may be applied also for measuring the amount of ions in ionized air generated by a fan-type ion generating apparatus.

INDUSTRIAL APPLICABILITY

The air ion measuring apparatus can be used for measuring the amount of ions generated by an ion generating apparatus used in a manufacturing line for manufacturing or assembling electronic components.

What is claimed is:

1. An air ion measuring apparatus for measuring the amount of ions in ionized air comprising:
   a detection electrode having a passage hole through which the ionized air passes;
   a detection element for detecting a detection current in the detection electrode; and
   a calculating element for calculating the amount of ions from an ion current which is calculated from the detection current, wherein
   when the length of the detection electrode is denoted by "l", a flow rate of air is denoted by "U", a detection current in the detection electrode is denoted by "I$_m$", and a time constant is denoted by "τ", a carried ion current "I$_0$" is calculated by $$I_0 = \frac{U\tau + l}{l} I_m.$$

2. The air ion measuring apparatus according to claim 1, wherein the detecting electrode is a cylindrical electrode formed with a hole through which ionized air is passed.

3. The air ion measuring apparatus according to claim 1, which is used in combination with an ion generating apparatus having a discharge electrode and an opposite electrode, wherein an ion generating space is formed between the opposite electrode and the discharge electrode, wherein the ion generating apparatus ionizes air in the ion generating space by corona discharge which is generated by an alternating voltage applied to the discharge electrode and the opposite electrode,
   wherein the ionized air ejected from the ion generating space includes a positive ion cluster and a negative ion cluster, and
   the length of the detection electrode through which ionized air ejected from the ion generating space is passed is smaller than a distance between ion clusters, which is calculated from a period between ion clusters, which is defined between a period of the positive ion cluster and a period of the negative ion cluster, and the flow rate of air.

4. The air ion measuring apparatus according to claim 1, which has flow rate detecting means for detecting the flow rate of air.

5. The air ion measuring apparatus according to claim 1, wherein the detection electrode is composed of first and second electrodes for measuring the amount of ions in ionized air, wherein the first and second electrodes are separated from each other in a flowing direction of the ionized air, wherein the velocity of air is calculated from a time lag between a detection current in the first electrode and a detection current in the second electrode.

6. The air ion measuring apparatus according to claim 1, which has flow rate setting means for setting a flow rate of air.

7. The air ion measuring apparatus according to claim 2, which has flow rate detecting means for detecting the flow rate of air.

8. The air ion measuring apparatus according to claim 2, wherein the detection electrode is composed of first and second electrodes for measuring the amount of ions in ionized air, wherein the first and second electrodes are separated from each other in a flowing direction of the ionized air, wherein the velocity of air is calculated from a time lag between a detection current in the first electrode and a detection current in the second electrode.

9. The air ion measuring apparatus according to claim 2, which has flow rate setting means for setting a flow rate of air.

10. The air ion measuring apparatus according to claim 3, which has flow rate detecting means for detecting the flow rate of air.

11. The air ion measuring apparatus according to claim 3, wherein the detection electrode is composed of first and second electrodes for measuring the amount of ions in ionized air, wherein the first and second electrodes are separated from each other in a flowing direction of the ionized air, wherein the velocity of air is calculated from a time lag between a detection current in the first electrode and a detection current in the second electrode.

12. The air ion measuring apparatus according to claim 3, which has flow rate setting means for setting a flow rate of air.

13. The air ion measuring apparatus according to claim 2, which is used in combination with an ion generating apparatus having a discharge electrode and an opposite electrode, wherein an ion generating space is formed between the opposite electrode and the discharge electrode, wherein the ion generating apparatus ionizes air in the ion generating space by corona discharge which is generated by an alternating voltage applied to the discharge electrode and the opposite electrode, wherein the ionized air ejected from the ion generating space includes a positive ion cluster and a negative ion cluster, and the length of the detection electrode through which ionized air ejected from the ion generating space is passed is smaller than a distance between ion clusters, which is calculated from a period between ion clusters, which is defined between a period of the positive ion cluster and a period of the negative ion cluster, and the flow rate of air.

14. The air ion measuring apparatus according to claim 13, which has flow rate detecting means for detecting the flow rate of air.

15. The air ion measuring apparatus according to claim 13, wherein the detection electrode is composed of first and second electrodes for measuring the amount of ions in ionized air, wherein the first and second electrodes are separated from each other in a flowing direction of the ionized air, wherein the velocity of air is calculated from a time lag between a detection current in the first electrode and a detection current in the second electrode.

16. The air ion measuring apparatus according to claim 13, which has flow rate setting means for setting a flow rate of air.

\* \* \* \* \*